United States Patent
Al-Shyoukh et al.

(10) Patent No.: US 7,199,621 B1
(45) Date of Patent: Apr. 3, 2007

(54) LOW AC IMPEDANCE INPUT STAGE FOR FAST STARTUP APPLICATIONS

(75) Inventors: Mohammad A. Al-Shyoukh, Richardson, TX (US); Raul A. Perez, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/324,645

(22) Filed: Jan. 3, 2006

(51) Int. Cl.
*H03K 5/22* (2006.01)

(52) U.S. Cl. .......................................... 327/65; 327/427
(58) Field of Classification Search .................. 327/65, 327/563, 427
See application file for complete search history.

(56) References Cited

U.S. PATENT DOCUMENTS 6,501,320 B1 * 12/2002 Le .............................. 327/330
6,788,113 B2 * 9/2004 Watanabe et al. ............ 327/563
7,038,501 B2 * 5/2006 Lee et al. .................... 327/108
7,123,057 B2 * 10/2006 Wang et al. .................. 327/65

* cited by examiner

*Primary Examiner*—Long Nguyen
(74) *Attorney, Agent, or Firm*—Alan K. Stewart; W. James Brady; Frederick J. Telecky, Jr.

(57) ABSTRACT

The low AC impedance input stage circuit for fast startup applications includes: a first transistor coupled between a first input node and a first output node; a second transistor coupled between a second input node and a second output node, and having a control node coupled to a control node of the first transistor; a third transistor coupled to the first input node and having a control node coupled to the control node of the first transistor; a fourth transistor coupled to the second input node and having a control node coupled to the control node of the third transistor; a first blocking device coupled between the third transistor and a first current source; a second blocking device coupled between the fourth transistor and the first current source; and a bias device coupled between the first current source and the control node of the first transistor.

12 Claims, 1 Drawing Sheet

LOW AC IMPEDANCE INPUT STAGE FOR FAST STARTUP APPLICATIONS

FIELD OF THE INVENTION

The present invention relates to electronic circuitry and, in particular, to a low AC impedance input stage for fast startup applications.

BACKGROUND OF THE INVENTION

Low AC Impedance Input Stages are widely used in a variety of applications including linear and low-dropout voltage regulators (LDOs), high performance opamps, and a variety of applications requiring current-mode amplification stages. Typical prior art implementations of low AC impedance input stages suffer from slow startup problems due to the presence of an undesired DC path between the positive and negative inputs of the input stage. This undesired DC path results in very slow startup times in applications which may require fast startup times (e.g. LDOs, and Opamps). The slow startup problem present in typical prior art implementations of the low AC impedance input stage is explained below.

FIG. 1 shows a typical prior art implementation of a PMOS based low AC impedance input stage. The stage consists of four P-channel field effect transistors (FETs) MP1–MP4, and a tail current bias I1 for two of the four FETs MP2 and MP3. FETs MP2 and MP3 are equally-sized diode connected FETs such that the combined drain currents of FETs MP2 and MP3 are equal to the tail current 2I. Under perfectly balanced conditions the voltage on input node V+ equals the voltage on input node V−, and the current on output node I+ equals the current on output node I−. A small input differential voltage of 2•V (•V on the V+ pin and −•V on the V− pin) creates a small output differential current of 2•I (•I on the I+ pin and −•I on the I− pin). The differential currents typically go to the common gate devices in a folded cascade gain stage but can also be used in a wide variety of arrangements to realize gain. The slow startup problem in this stage is caused by the following scenario: Suppose at the instant of startup a buffer is driving the V+ pin while the V− pin is at ground (e.g. through the presence of a significant capacitive load at the V− node). This will activate the parasitic DC path from node V+ through the diode connected FET MP2, through the body diode of FET MP3, (activated as the drain of FET MP3 goes above the bulk of FET MP3) to node V−, essentially creating a short between nodes V+ and V− upon startup. This parasitic path, shown in FIG. 1, would significantly overload any buffer driving node V+, and therefore significantly slow the startup transient. It could also cause any buffer driving node V+ to oscillate due to the sudden activation of this parasitic DC path and the load that this would present to the driving buffer.

In a typical high-input-impedance differential pair where the input signal is coupled to the gate of the input FETs, no such parasitic path exists due to the high input impedance present at the input pins. The speed-to-power ratio, however, in a standard high-input-impedance differential pair input stage is significantly worse than that in a low-impedance input stage, which is why the use of low-impedance input stages is on the increase in low power applications.

SUMMARY OF THE INVENTION

A low AC impedance input stage circuit for fast startup applications includes: a first transistor coupled between a first input node and a first output node; a second transistor coupled between a second input node and a second output node, and having a control node coupled to a control node of the first transistor; a third transistor coupled to the first input node and having a control node coupled to the control node of the first transistor; a fourth transistor coupled to the second input node and having a control node coupled to the control node of the third transistor; a first blocking device coupled between the third transistor and a first current source; a second blocking device coupled between the fourth transistor and the first current source; and a bias device coupled between the first current source and the control node of the first transistor.

DETAILED DESCRIPTION OF PREFERRED EMBODIMENTS

Figure 1:
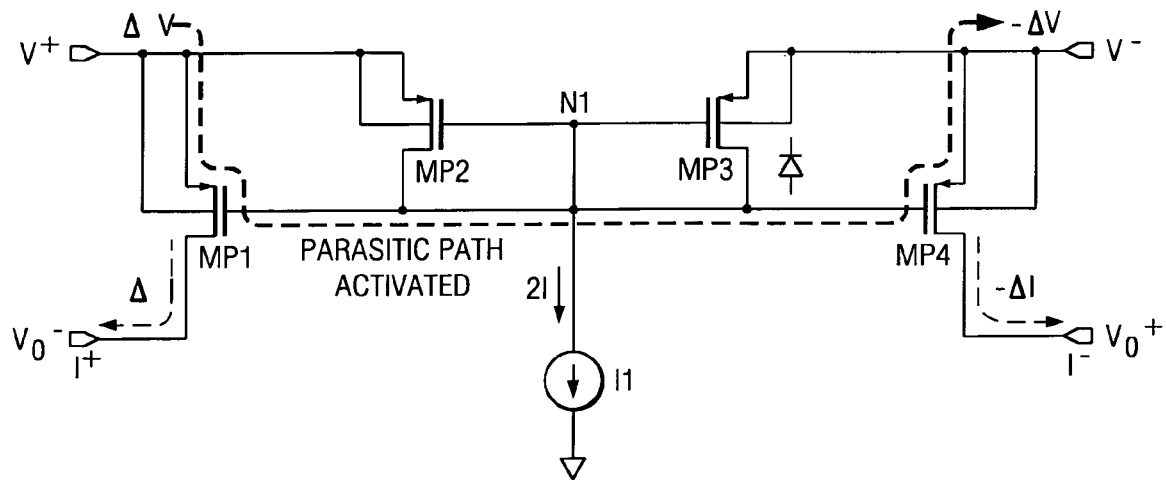
FIG. 1 is a circuit diagram of a prior art low AC impedance input stage.
Figure 2:
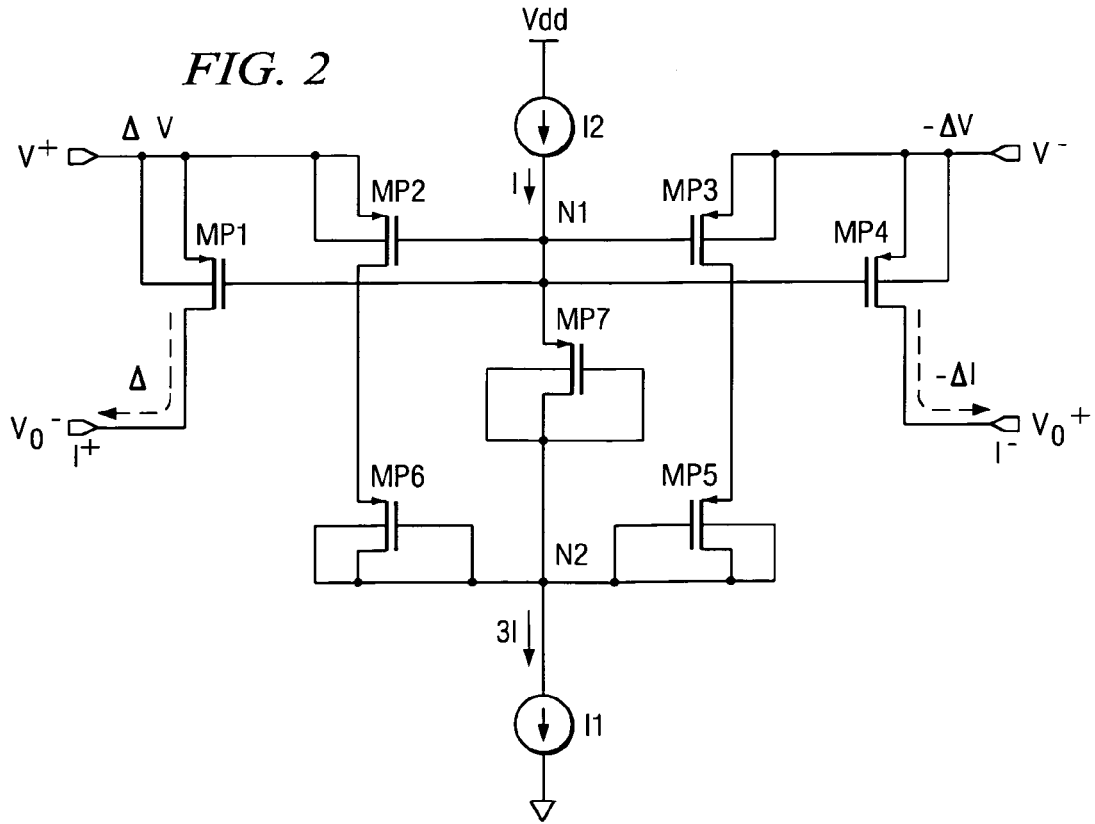
FIG. 2 is a circuit diagram of a preferred embodiment low AC impedance input stage, according to the present invention.

An enhanced low AC impedance input stage for fast startup applications, according to the present invention, blocks the parasitic DC path of the prior art input stage of FIG. 1. A preferred embodiment input stage is shown in FIG. 2. Two blocking PMOS FETs MP5 and MP6 have been added to the input stage, and a biasing FET MP7 creates the necessary bias conditions for the blocking FETs. A current source I2 with a current value equal to I, has also been added for the purpose of biasing FET MP4 which in turn biases the two blocking FETs MP5 and MP6. The magnitude of the tail current source I1 has been increased to 3I to sink the additional bias current from source I2 that is added to the stage. The blocking FETs MP5 and MP6, as well as the biasing FET MP7 for the blocking FETs are all diode connected FETs but all have their drains connected to their bulk as shown in FIG. 2.

During normal operation of the input stage, FETs MP5–MP7 are all conducting current through a mixture of channel conduction and body diode conduction. When the stage is operating under perfectly balanced conditions, FET MP3 will conduct a current equal to I through its channel and FET MP5 will conduct that exact same current through a mixture of channel conduction and body diode conduction. The body diode conduction in FET MP5 happens since the source of FET MP5 (realized by P-diffusion) is at a higher potential than the bulk of FET MP5 (realized by an N-well). The exact same thing can be said about FETs MP2 and MP6. It should be noted that channel conduction in FETs MP5–MP7 would be greatly helped by the fact that connecting the drain to the bulk would reduce the threshold voltage ($V_t$) required to invert the channel in each of these devices. Due to this decrease in $V_t$, diode-connected FETs MP4–MP6 will all be operating at a very low drain to source voltage ($V_{ds}$) and accordingly very little additional headroom voltage is required to operate this input stage vs. the prior art input stage in FIG. 1. In summary, during normal operation FETs MP5–MP7 are all conducting through a mixture of channel conduction and body diode conduction.

During startup conditions and as was mentioned above, node V+ is at a high potential, while node V− is still at ground. During that condition the body diode of FET MP3 is forward biased (due to the P-diffusion of its drain being at a higher potential than its N-well bulk). The body diode of FET MP5, however, is reverse biased due to its N-well being at a higher potential than the P-diffusion of its source. Furthermore, the channel of FET MP5 is off because the gate of FET MP5 is at a higher potential than its source. Since both the channel and the body diode of FET MP5 are both off, no parasitic path between nodes V+ and V− exists in this stage. The same argument can be applied for FET MP6 which protects against the parasitic path formed in the reverse direction (i.e. from node V− through FET MP3 and then the body diode of FET MP2) should that parasitic path ever be activated. In summary, any parasitic path between nodes V+ and V− is blocked in the preferred embodiment. This enables more robust operation for all applications which use this type of input stage where large signal transitions are present. It also guarantees fast and clean startup in all applications using this class of input stages The enhanced low AC impedance input stage, according to the present invention, provides several advantages. The input stage blocks the activation of parasitic paths between the inverting (positive) and non-inverting (negative) inputs of the input stage enabling robust operation for all applications requiring fast startup which utilize this class of input stage. Furthermore, more robust large signal operation with no possibility of activating any parasitic path between the input and the output is enabled in general. The aforementioned features of this enhanced input stage are achieved at minimal overhead both in the headroom and power consumption required to operate the stage.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A low AC impedance input stage circuit comprising:
   a first transistor coupled between a first input node and a first output node;
   a second transistor coupled between a second input node and a second output node, and having a control node coupled to a control node of the first transistor;
   a third transistor coupled to the first input node and having a control node coupled to the control node of the first transistor;
   a fourth transistor coupled to the second input node and having a control node coupled to the control node of the third transistor;
   a first blocking device coupled between the third transistor and a first current source;
   a second blocking device coupled between the fourth transistor and the first current source; and
   a bias device coupled between the first current source and the control node of the first transistor.

2. The circuit of claim 1 further comprising a second current source coupled to the control node of the first transistor.

3. The circuit of claim 1 wherein the first blocking device is a transistor.

4. The circuit of claim 1 wherein the second blocking device is a transistor.

5. The circuit of claim 1 wherein the bias device is a transistor.

6. The circuit of claim 1 wherein the first blocking device is a PMOS transistor.

7. The circuit of claim 1 wherein the second blocking device is a PMOS transistor.

8. The circuit of claim 1 wherein the bias device is a PMOS transistor.

9. The circuit of claim 2 wherein a current in the first current source is three times a current in the second current source.

10. The circuit of claim 1 wherein the first blocking device is a diode connected transistor.

11. The circuit of claim 1 wherein the second blocking device is a diode connected transistor.

12. The circuit of claim 1 wherein the bias device is a diode connected transistor.

* * * * *